United States Patent [19]

Adams et al.

[11] 4,171,489

[45] Oct. 16, 1979

[54] RADIATION MASK STRUCTURE

[75] Inventors: Arthur C. Adams, Berkeley Heights; Cesar D. Capio, Fords; Hyman J. Levinstein, Berkeley Heights; Ashok K. Sinha, New Providence; David N. Wang, Warren Township, Somerset County, all of N.J.

[73] Assignee: Bell Telephone Laboratories, Incorporated, Murray Hill, N.J.

[21] Appl. No.: 941,776

[22] Filed: Sep. 13, 1978

[51] Int. Cl.² ............................................. G21F 3/02
[52] U.S. Cl. .................................... 250/510; 250/482
[58] Field of Search ................................ 250/510, 482

[56] References Cited

U.S. PATENT DOCUMENTS

| 3,742,230 | 6/1973 | Spears et al. | 250/510 |
| 3,873,824 | 3/1975 | Bean et al. | 250/510 |

Primary Examiner—Harold A. Dixon
Attorney, Agent, or Firm—Herbert M. Shapiro; Arthur J. Torsiglieri

[57] ABSTRACT

The discovery that boron nitride and boron carbide films can be made in tension allows nondistorting radiation windows or masks to be realized. Both low and high pressure techniques for making the tensile films lead to related mask structures utilizing such films. The resulting structures are sufficiently distortion free to be useful for x-ray lithography.

18 Claims, 8 Drawing Figures

RADIATION MASK STRUCTURE

FIELD OF THE INVENTION

This invention relates to radiation masks employed in processing techniques for the manufacture of devices with microscopic geometries such as semiconductor devices.

BACKGROUND OF THE INVENTION

Fine line geometries, common in semiconductor integrated circuits, are defined by radiation responsive resists which coat the surface of a semiconductor chip and, for example, polymerize in accordance with an exposure pattern projected at the surface of the chip. The nonpolymerized portion of the resist is removed leaving a pattern which acts as a mask to a subsequent diffusion step or as a mask to an etchant or to a metal deposition step. In these cases, a pattern of diffused, etched, or coated regions results respectively.

It is important that a semiconductor chip be used efficiently because more efficient utilization of the chip leads to a lower cost per bit or function performed. Naturally, an urgency exists to define functions in increasingly smaller areas of the chip.

Increasingly smaller feature size for devices in a chip is achieved by sophisticated processing including a faithful reproduction of a pattern in the resist. But a faithful reproduction requires an accurate master or mask. The problem to which the present invention is directed is to obtain a radiation-transparent film or window which is structurally stable and free of distortion over the ranges of common processing conditions so that radiation-opaque features, defined on such a film, can serve as a distortion-free radiation mask. Inasmuch as the mask is employed to pattern a beam of uniform radiation (i.e., optical or x-ray) it is also required that the mask allow that radiation to pass selectively to the surface of the resist where no opaque features exist to obstruct that passage.

Distortion free masks have been difficult to make hitherto because the windows have been made of thin films which respond differently to different processing conditions. An attempt to avoid distortion under such different conditions has led to lamellate, stress-compensated windows as disclosed in G. A. Coquin et al, U.S. Pat. No. 4,037,111.

BRIEF DESCRIPTION OF THE INVENTION

The invention is based on the discovery that boron containing films, such as an amorphorous boron nitride (BN) or a boron carbide (BC) film can be made tensile, if boron rich or if doped with silicon, such a film is substantially distortion free and transparent to optical and x-radiation. The invention is based, in one embodiment, on the realization that a tensile film of BN can be deposited on a film of Kapton ® (or polyimide) bonded to a ring of Pyrex ® glass to form a mask structure which is essentially unaffected by changes in temperature or humidity.

The boron nitride film is formed from, for example, a gaseous mixture of 15% diborane ($B_2H_6$) by weight diluted in Argon and 100% ammonia ($NH_3$) and in the presence of nitrogen gas. Low pressure processing for the deposition of BN on Kapton ® has been carried out (as above) at temperatures of from 250 degrees C to 400 degrees C.

In another embodiment, high pressure processing for deposition of BN on silicon films has been carried out at temperatures of from 400 degrees C to 800 degrees C from a 1% diborane mixture with 5% ammonia. The silicon substrate, in masks made with high pressure processing, may be etched selectively by conventional techniques using, for example, HF acid, to form windows through which radiation passes. The remaining silicon remains to form a frame (which may include a grid) to provide a structural support for the BN film.

Although tensile BN or BC films are commonly boron rich, the amount of excess boron controls the stress and can be excessive. Consequently, an acceptable range of gas ratios of $NH_3/B_2H_6$ is determined by the necessity to have the film under tensile stress and the necessity to prevent the film from cracking. A range of from 0.13 to 0.25 has been found acceptable. The addition of silicon to films of, for example, stoichiometric BN (compressive) also produces tensile films with particularly attractive transparency characteristics.

DETAILED DESCRIPTION

Figure 1:
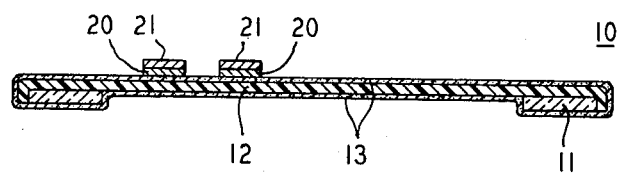
FIGS. 1 and 2 show alternative cross-sectional views of radiation masks in accordance with this invention.
Figure 2:
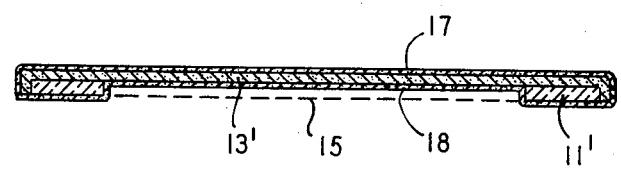
Figure 3:
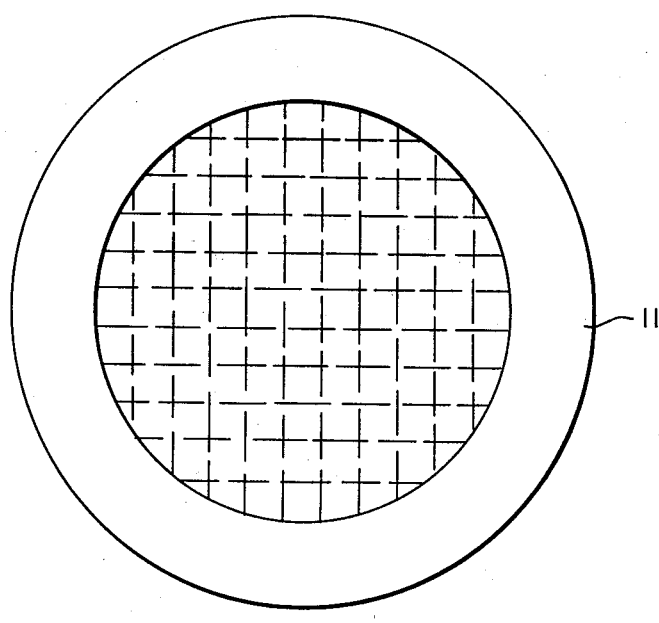
FIG. 3 shows a top view of a radiation mask (or window) in accordance with this invention.

FIGS. 1, 2, and 3 show cross-sectional and top views of illustrative mask (or window) structures. In FIG. 1, the mask 10 comprises, for example, a glass ring or support frame 11 shown also in FIG. 3. The glass is typically Pyrex ® glass 0.25 inch thick having a mean diameter of 4.5 inch. A layer 12 of Kapton ® (or polyimide) is stretched over the ring and bonded to it with epoxy. The resulting structure is placed in a diffusion or oxidation type furnace and exposed to a gaseous mixture of $NH_3/B_2H_6$ in a nitrogen carrier to form a boron rich boron nitride film 13 typically 0.04 mils thick over the entire structure as shown in FIG. 1. Before discussing the properties and conditions of boron nitride films, a description of an alternative embodiment is discussed in connection with FIG. 2. FIG. 2 specifically shows a cross section of a mask structure similar to that shown in FIG. 1. In this instance, the ring 11' comprises silicon and the tensile boron nitride film 13' is formed in accordance with the process shown in FIG. 4.

Figure 4:
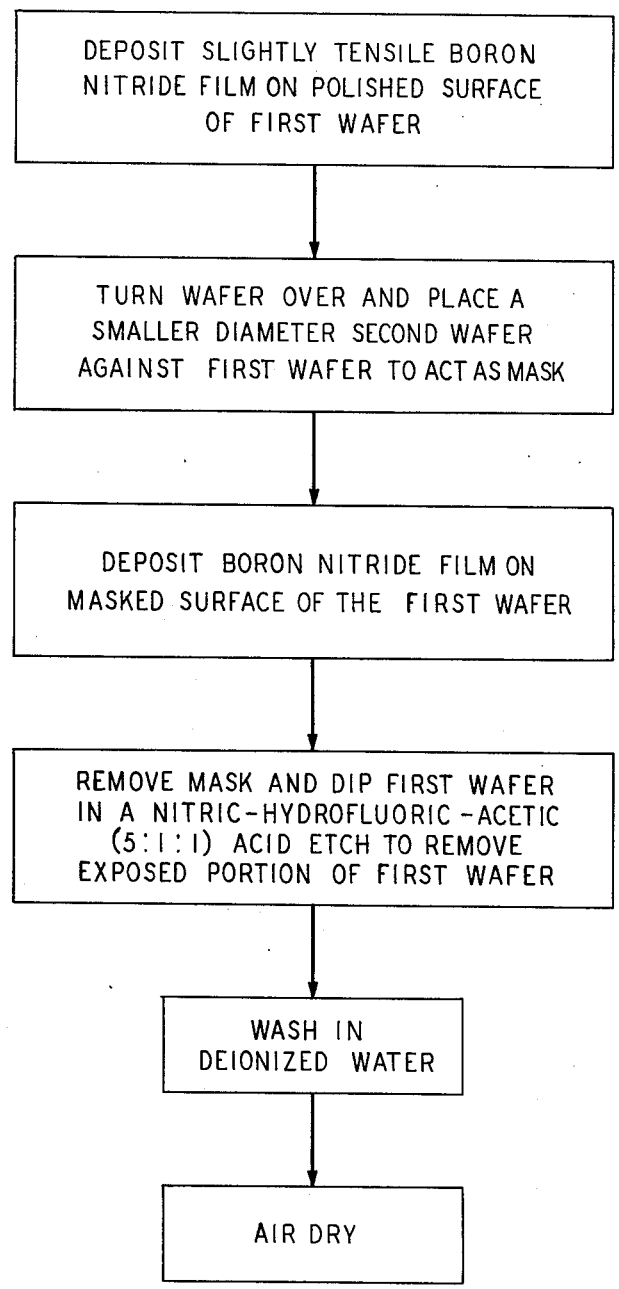
FIG. 4 is a block diagram for a process for making the mask of FIG. 2.

As shown in the top block of FIG. 4, a slightly tensile boron nitride film is deposited under high pressure conditions, for example, on a polished surface of a silicon wafer 4.4 inches in diameter and 20 mils thick by chemical vapor deposition. A film 0.25 mils thick is usually deposited. A second silicon wafer is placed against the reverse side of the first wafer as shown by the second block of FIG. 4. This second wafer has a diameter about equal to that of the inside edge of ring 11' of FIG. 2 and acts as a mask to a subsequent film deposition.

The third block indicates a subsequent exposure to $NH_3/B_2H_6$ in a high pressure furnace. This step results in the formation of film 13' of FIG. 2. The mask is removed and the resulting structure is dipped, for example, in nitric-hydrofluoric-acetic (5:1:1) acid etch to remove the uncoated portion of the first wafer as represented by the region above the broken line 15 in FIG. 2. The resulting structure is rinsed in deionizing water and air dried as shown in the last two blocks of FIG. 4.

The properties of the boron nitride films are alike in the two embodiments and are now discussed fully. The deposition conditions, on the other hand, are shown above to be different. These conditions are also discussed hereinbelow. It is to be understood that low temperature, low pressure deposition conditions are necessitated herein only to insure the integrity of the Kapton ® or polyimide film when such a film is used as the deposition surface.

Figure 5:
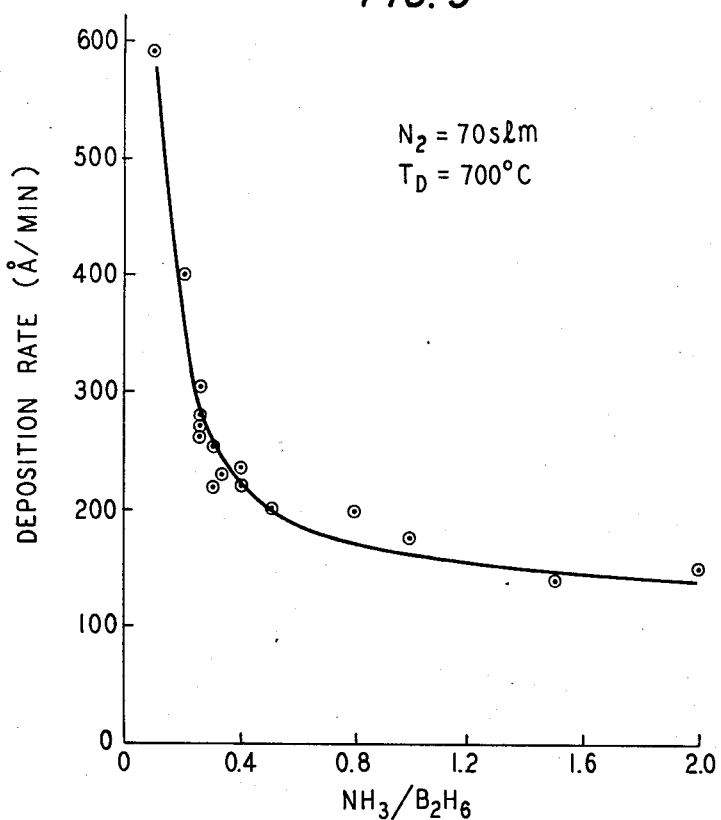
FIG. 5 is a graph of film deposition rate versus $NH_3/B_2H_6$ gas ratio.

The properties of the boron nitride films and the deposition conditions are summarized in Table 1. The experimental parameter found to play a major role in determining the properties of the boron nitride film is the $NH_3/B_2H_6$ gas ratio. The deposition rate is found to be very sensitive to the $NH_3/B_2H_6$ ratio. The rate decreases with increasing $NH_3/B_2H_6$ gas ratio as can be seen in FIG. 5. The deposition rate is nearly independent of temperature, being 1.08 times faster at 775 degrees C. than at 650 degrees C. A slight improvement in the wafer-to-wafer uniformity is observed at a deposition temperature of 650° C. Increasing the deposition temperature increases the compressive stress.

TABLE 1

| $NH_3/B_2H_6$ | Dep. Temp. (°C.) | Dep. Time (Min.) | Thickness (A) | Dep. Rate (A/Min.) | Stress $\times 10^9$ dynes/cm$^2$ |
|---|---|---|---|---|---|
| 0.25 | 700° C. | 15 | 4200 | 280 | +.025 |
| 5 | 700° C. | 15 | 2600 | 173 | −2.6 |
| 18.0 | 700° C. | 20 | 2600 | 130 | −3.2 |
| 12.9 | 700° C. | 15 | 2450 | 163 | — |
| 2 | 700° C. | 15 | 2325 | 155 | −2.7 |
| 0.44 | 700° C. | 10 | 2210 | 221 | −0.02 |
| 0.10 | 700° C. | 10 | 5980 | 598 | +2.8 |

Figure 6:
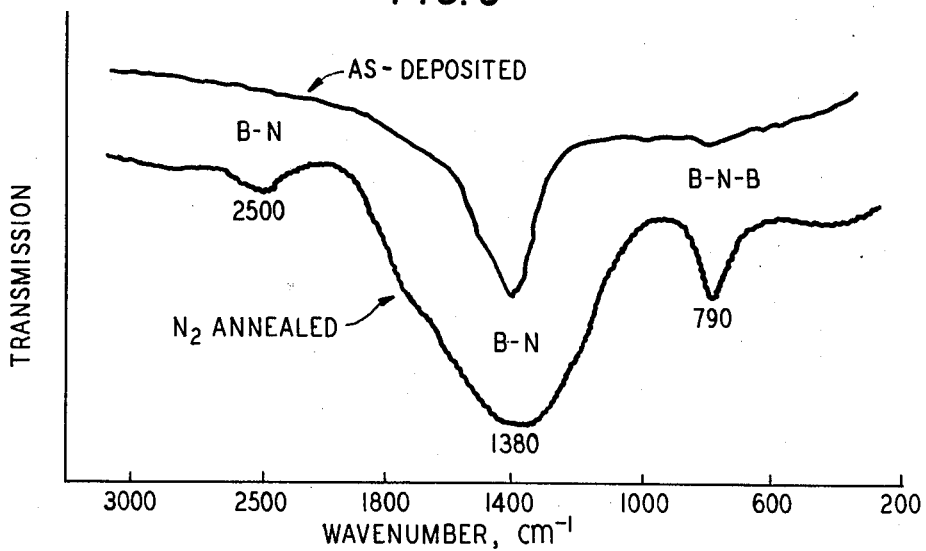
FIG. 6 is a graph showing the infrared spectra of as-deposited and annealed BN films.

The identification of the film as boron nitride is based solely on the infrared spectra. The infrared spectra of the boron nitride films deposited at 700 degrees C. exhibit a strong asymmetric B-N absorption peak, the stretching bond, at 1380 cm$^{-1}$ and a very weak peak at 790 cm$^{-1}$. Lowering the $NH_3/B_2H_6$ gas ratio leads to the broadening of the B-N peak accompanied by a reduction of its amplitude. The B-N peak disappears for $NH_3/B_2H_6 \leq 0.1$. Annealing the boron nitride film in $N_2$ ambient at 1000 degrees C. for one hour results in the broadening of the B-N peak, the appearance of a weak peak at 2500 cm$^{-1}$, and an increase in amplitude of the peak at 790 cm$^{-1}$. The infrared spectra of the as as-deposited and annealed boron nitride films are shown in FIG. 6.

CVD boron nitride is observed to be highly resistant to acids. In, for example, the above nitric-hydrofluoric-acetic acid solution (5:1:1), an etchant used for making the boron nitride windows, the etch rate is <0.5 A/min. In boiling phosphoric acid the etch rate is <10 A/min.

Figure 7:
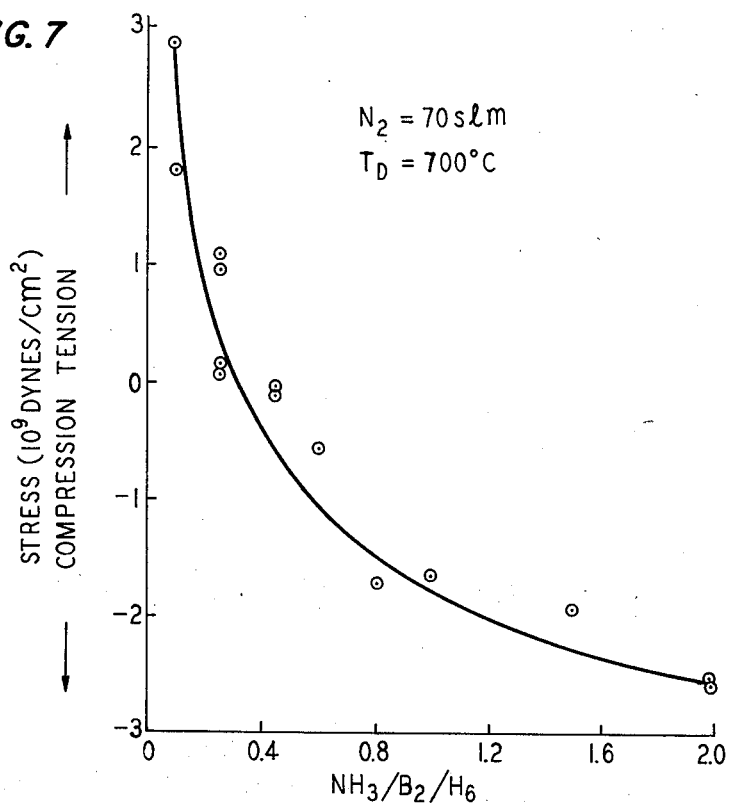
FIG. 7 is a graph showing film stress versus $NH_3/B_2H_6$ gas ratio.

A plot of the film stress versus $NH_3/B_2H_6$ gas ratio is shown in FIG. 7. Within the range of gas ratios examined (0.1 to 18.0), films that are particularly suitable as substrates for mask metallization (slightly tensile) are obtained within the narrow range of $NH_3/B_2H_6$ gas ratios, 0.25 to 0.275. At these preferred ratios, optically transparent and mechanically strong, 3-inch diameter, boron nitride windows have been found to be dimensionally stable. In the narrow range ($NH_3/B_2H_6=0.25$ to 0.275), the deposition rate varies from 220 to 300 A/min. and the refractive index ranges from 1.9 to 2.2. The experimental data showing reproducibility of the depositions are summarized in Table 2.

TABLE 2

| $NH_3/B_2H_6$ | Dep. Time (Min.) | Thickness (A) | Dep. Rate (A/Min.) | Stress $\times 10^{19}$ (dynes/cm$^2$) |
|---|---|---|---|---|
| 0.25 | 10 | 2655 | 265.5 | — |
| 0.25 | 20 | 5204 | 260.2 | +0.8 |
| 0.25 | 30 | 7665 | 255.5 | +0.5 |
| 0.25 | 40 | 10600 | 265.0 | +1.1 |
| 0.25 | 50 | 13125 | 262.5 | +0.1 |
| 0.25 | 60 | 16000 | 266.6 | +0.3 |

For $NH_3/B_2H_6 \leq 0.24$, the boron nitride films are in high tensile stress. For $NH_3/B_2H_6 = >0.3$, the films are in compressive stress. Under these two conditions, experimental films have been found too fragile to serve as support for mask metallizations.

Under one set of deposition conditions ($NH_3/B_2H_6=0.25$), only a small area, approximately 5"×6" on the familiar graphite susceptor, close to the upstream end (of the high pressure furnace), is usable; yielding a thickness variation over a 4" diameter wafer of less than 15%. This condition imposes a restriction on the throughput of the deposition system to one 4" wafer or two 3" wafers per deposition run.

Figure 8:
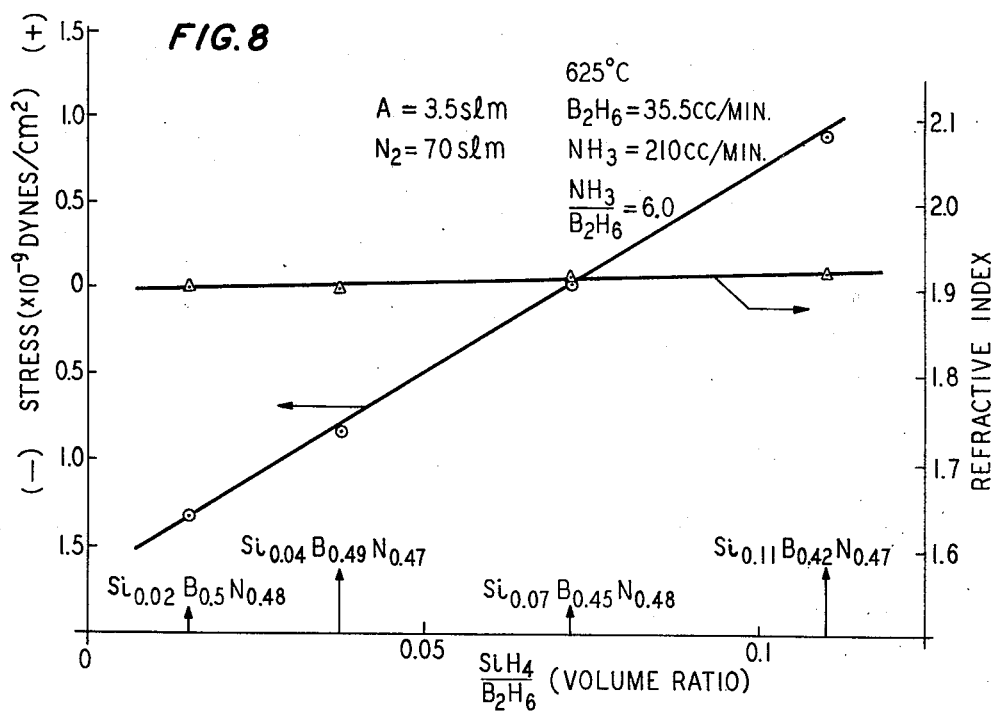
FIG. 8 is a graph of the affect of silicon on nearly stoichiometric BN.

It has been found also that approximately 10 atomic percent of silicon can be added to stoichiometric boron nitride film to change the stresses in the film from compressive to tensile without degrading the optical transparency of the film. The effect of silicon on films formed from a representative $NH_3/B_2H_6=6.0$ gas ratio is shown in the graph of FIG. 8. The silicon is added by employing silane (with 100% ammonia) in the gaseous mixture from which the film is formed. Silicon containing films exhibit excellent transparency to both x-ray and optical radiation as can be seen from FIG. 8. It is to be noted from the Figure that the right-hand scale shows only a slight change of refractive index with increasing silicon and that film compositions follow gas compositions. The members at the bottom of the graph are atomic fractions for film compositions on the graph.

The invention has been disclosed in terms of BN. But a similar system comprises BC formed from a gaseous mixture of diborane 15% (by weight) with acetylene ($C_2H_2$) in nitrogen as a carrier. The preferred $C_2H_2$ to $B_2H_6$ range over which tensile BC films result in a low pressure environment is from 0.03 to 0.05. In BC films, silicon also improves transparency.

In practice, it is advantageous to coat a tensile boron nitride film with thin compressive BN film to prevent the nucleation of microflaws and, thus, strengthen the films. Thus, for example, a sixty thousand Angstrom unit tensile film of boron nitride is formed in a lamellate structure with top and bottom layers 17 and 18 of compressive BN, two thousand Angstroms thick, a mask structure of such a lamellate configuration is shown in FIG. 2. A supporting grid for the BN film, as indicated in FIG. 3 is achieved by employing a suitable resist pattern to the etch step represented by block 4 of FIG. 4.

The metallization for defining an opaque pattern on the radiation window of FIGS. 1–3 is shown schematically in FIG. 1 and can be seen to comprise two layers 20 and 21. The lower layer 20 typically comprises tantalum, the top layer 21 comprises gold.

Although tensile boron nitride and boron carbide films are contemplated for use as masks to optical or x-radiation primarily, bearing patterns of opaque elements for such purpose, the films also also useful for radiation windows common to x-ray equipment. In such equipment, no opaque patterns are employed.

Tensile BN or BC films have useful thicknesses of up to about 25 microns (1 mil) without excessive absorption of x-rays useful in lithography (43 Angstroms Palladium and L$\alpha$ and $SiO_2$ or Si). By comparison, useful silicon-based films have to be thinner than 2 microns.

We claim:

1. A radiation window arrangement comprising a tensile film of boron nitride, said film being bonded to a structurally stable support frame.

2. An arrangement in accordance with claim 1 wherein said support frame comprises Pyrex® glass and said film is formed on a layer of Kapton® stretched and bonded to said support.

3. An arrangement in accordance with claim 1 wherein said support frame comprises silicon.

4. An arrangement in accordance with claim 1 including thereon a pattern of material opaque to radiation.

5. An arrangement in accordance with claim 4 wherein said material opaque to radiation comprises gold.

6. An arrangement in accordance with claim 5 wherein said material comprises a lamellate structure of gold on tantalum.

7. An arrangement in accordance with claim 1 wherein said film is boron rich and is formed from a range of $NH_3/B_2H_6$ gas ratio in the range of from about 0.13 to 0.25.

8. An arrangement in accordance with claim 1 wherein said film is approximately stoichiometric BN and is doped with up to 10 atomic percent of silicon.

9. An arrangement in accordance with claim 8 wherein said film is formed from a gaseous mixture of $SiH_4/B_2H_6 \geq 0.07 \leq 0.12$ and $NH_3/B_2H_6 = 6.0$ at 625 degrees C.

10. An arrangement in accordance with claim 7 wherein said film is boron rich and is formed from a range of $NH_3/B_2H_6$ gas ratio in the range of from 0.25 to 0.275.

11. An arrangement comprising a structurally stable ring and a transparent tensile film bonded to said ring, said film comprising an amorphous boron compound.

12. An arrangement in accordance with claim 11 in which said film is boron nitride formed from a gaseous mixture of $NH_3/B_2H_6$ in a range of from about 0.13 to 0.25.

13. An arrangement in accordance with claim 12 in which said film comprises approximately stoichiometric boron nitride doped with up to about 10 atomic percent of silicon.

14. An arrangement in accordance with claim 13 in which said film is coated with relatively thin layers of BN in compression.

15. An arrangement in accordance with claim 11 in which said film is boron carbide formed from a gaseous mixture of $C_2H_2/B_2H_6$ in a range of from about 0.03 to 0.05.

16. An arrangement in accordance with claim 12 in which said film is coated with relatively thin layers of BN in compression.

17. An arrangement in accordance with claim 1 wherein said support frame comprises Pyrex® glass and said film is formed on a layer of polyimide stretched and bonded to said support.

18. A radiation window (10) comprising a stable support frame (11), characterized by a tensile film (13) of an amorphous boron compound bonded to said frame.

* * * * *